US008671563B2

(12) United States Patent
Maijala et al.

(10) Patent No.: US 8,671,563 B2
(45) Date of Patent: Mar. 18, 2014

(54) METHOD FOR PRINTING A CONDUCTIVE PATTERN

(75) Inventors: Juha Maijala, Tuusula (FI); Juha Merta, Vantaa (FI); Sanna Lehti, Vantaa (FI)

(73) Assignee: Oy Keskuslaboratorio-Centrallaboratorium AB, Espoo (FI)

( * ) Notice: Subject to any disclaimer, the term of this patent is extended or adjusted under 35 U.S.C. 154(b) by 820 days.

(21) Appl. No.: 12/373,229

(22) PCT Filed: Jul. 6, 2007

(86) PCT No.: PCT/FI2007/050419
§ 371 (c)(1),
(2), (4) Date: Mar. 11, 2009

(87) PCT Pub. No.: WO2008/006941
PCT Pub. Date: Jan. 17, 2008

(65) Prior Publication Data
US 2009/0277007 A1    Nov. 12, 2009

(30) Foreign Application Priority Data
Jul. 11, 2006  (FI) ..................... 20060673

(51) Int. Cl.
*H01K 3/22* (2006.01)
*H01R 9/00* (2006.01)
*H01K 3/00* (2006.01)
*H05K 3/02* (2006.01)
*H05K 3/10* (2006.01)

(52) U.S. Cl.
USPC .................. 29/851; 29/843; 29/846

(58) Field of Classification Search
USPC ........ 29/851, 843, 846; 438/584; 156/60, 230
See application file for complete search history.

(56) References Cited

U.S. PATENT DOCUMENTS 4,303,698 A * 12/1981 Beske et al. ............. 427/98.4
4,698,907 A * 10/1987 Soszek ..................... 29/846
(Continued)

FOREIGN PATENT DOCUMENTS

EP      0034817 A2    9/1981
EP      0297678 A1    1/1989
(Continued)

OTHER PUBLICATIONS

International Search Report for PCT/FI2007/050419 dated Oct. 24, 2007.
(Continued)

*Primary Examiner* — David Angwin
(74) *Attorney, Agent, or Firm* — McCormick, Paulding & Huber LLP

(57) ABSTRACT

The invention concerns a method for forming an electrically conductive pattern on an insulating substrate. In the method, particle-type electrically conductive matter is transferred onto a surface of the substrate and the particle-type electrically conductive matter is at least partially sintered at elevated temperature and pressure in order to convert the particle-type electrically conductive matter into a continuously electrically conductive pattern affixed to the substrate. According to the invention, the electrically conductive matter is transferred in the form of a predefined pattern, and the sintering is carried out by using a nip comprising two opposing nip members between which the substrate is fed. The method provides an efficient way of making high-resolution conductor structures at low temperatures.

26 Claims, 7 Drawing Sheets

(56) References Cited

U.S. PATENT DOCUMENTS

| | | | | |
|---|---|---|---|---|
| 5,014,420 A | * | 5/1991 | Howard et al. | 29/846 |
| 6,816,125 B2 | * | 11/2004 | Kuhns et al. | 343/880 |
| 7,386,936 B2 | * | 6/2008 | Huhtasalo et al. | 29/846 |
| 2006/0057827 A1 | * | 3/2006 | Huhtasalo et al. | 438/584 |

FOREIGN PATENT DOCUMENTS

| | | |
|---|---|---|
| JP | 59-81063 U | 5/1984 |
| JP | 01-124916 A | 5/1989 |
| JP | 08-255521 A | 10/1996 |
| JP | 11298119 A | 10/1999 |
| JP | 2004172283 A | 6/2004 |
| JP | 2004273205 A | 9/2004 |
| WO | 9514260 A1 | 5/1995 |
| WO | 0145935 A1 | 6/2001 |
| WO | 2004080137 A1 | 9/2004 |
| WO | 2004080138 A1 | 9/2004 |

OTHER PUBLICATIONS

Finish Search Report dated May 25, 2007.
Translation of Office Action issued in corresponding Japanese Appln. No. 2009-518910 dated Mar. 26, 2012 (2 pages).

* cited by examiner

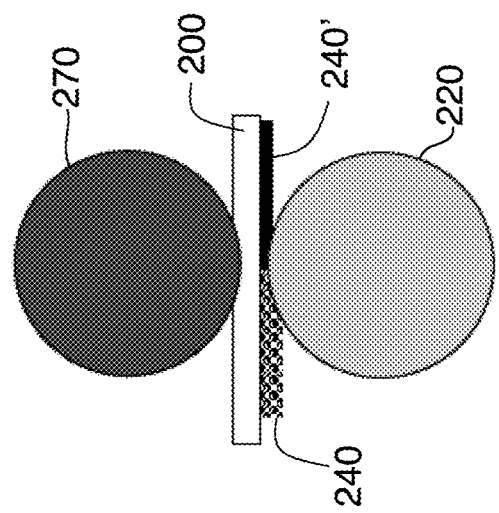
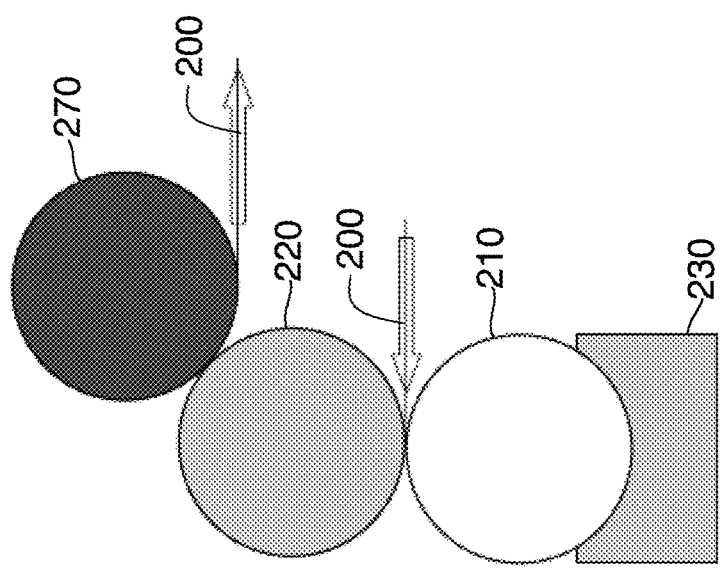

METHOD FOR PRINTING A CONDUCTIVE PATTERN

CROSS REFERENCE TO RELATED APPLICATIONS

This application is entitled to the benefit of and incorporates by reference essential subject matter disclosed in International Patent Application No. PCT/FI2007/050419 filed on Jul. 6, 2007 and Finish Patent Application No. 20060673 filed Jul. 11, 2006.

BACKGROUND OF THE INVENTION

1. Field of the Invention

The invention relates to printed conductive patterns. In particular, the invention concerns a method for forming conductive patterns on planar substrates. In the method, conductive material is applied on the surface of the substrate and the material treated so as to form a static pattern on the substrate. The invention also concerns an apparatus for carrying out the method.

2. Description of Related Art

Printing of electronics, especially on flexible substrates, pursues electronic components and applications for logistical solution, disposable electronics, even to printed displays. Nowadays, the printed electronics applications utilize methods familiar in traditional manufacture of electronic components such as electroplating and screen printing. Unfortunately, these methods are slow, not well suitable for porous substrates and/or substrates in web form. Also flexo and rotogravure printing has been used to print electronic components. Problems with these above mentioned methods are that they create structures with discontinuity (due to halftone dots), solvent evaporation and absorption of components in porous structures (with liquid materials). The main challenge with conductive polymers are insufficient electric conductivity and protection against effects of environment e.g. oxidation.

In WO 04/080138 there is disclosed one alternative method for forming electronic circuits on a substrate. In the method, metal powder is deposited as a layer on the substrate and some parts of the deposited surface are subjected to compression. At those areas, the powder is pressed into the substrate with a high-pressure hydraulic press in order to form a permanent conductor structure. The press is active for several seconds, even minutes. Thus, the method in relatively slow and involves using very high pressures, and therefore also massive equipment. The method is also based on deformation (compressibility) of the substrate. This causes mechanical weakening of the substrate, in particular, when paper substrates are concerned. Somewhat similar method, with the exception that it concerns forming uniform conductive layers, for example, for EMC shielding, is disclosed by EP 0297678.

Another methods for the manufacture of printed wiring boards by electrostatic printing are disclosed in U.S. Pat. No. 4,698,907 and WO 01/45935. WO 95/14260, on the other hand, discloses a buried electrode drum for electrostatic transfer of toner particles to surfaces.

U.S. Pat. No. 5,817,374 discloses a method for transferring charged particles on a receptor material as a thick layer by using a mask on the receptor. That is, the particles are first transferred through selective holes in the mask to the receptor and then the mask is removed from the receptor surface. The surface of the receptor may be coated or the particles may by polymerized or crosslinked on the surface in order to secure the layer to the receptor. The use of screens or masks of any kind is undesirable when the speed and resolution of particle transfer is concerned.

US 2002/0034617 discloses a method for transferring wet conductive toner to a wiring board by first adhering toner to cross-linked regions of a reusable imaging surface and then transferring the toner to the wiring board by a corona discharge. On the board the toner dries, after which it is subjected to oven treatment. In the last step, a copper layer is deposited on the dried toner in order to achieve good electrical conductivity. Thus, the method requires a large number of processing steps.

EP 0034817 concerns applying a mixture comprising metal particles and toner particles having adhesive properties when subjected to high temperature on a surface of an inert substrate. The mixture of the particles is then fired in order to finish the product. As a disadvantage in this method is that, as an auxiliary agent, adhesive toner is required in order to form the desired conductive pattern.

JP 11298119 discloses a copper-containing powder, which can be applied on ceramic substrates for forming electrical circuits. The powder includes also pressure-sensitive polymer and charge control agent. The powder is attached to the substrate by kneading. The method is not suitable for flexible substrates and does not allow using of low temperatures.

In addition, several techniques for printing conductive patterns using conductive pastes, gels and inks are known. However, application of liquid-phase materials is undesirable due to their complex processing and relatively low conductivities and/or resolution of the printed traces. Removal of the solvents or auxiliary agents initially included in the composition requires time-consuming steps.

The methods referred to above set certain limits to substrates which can be used in the methods. None of them is well suitable for paper substrates due to very high temperatures or substrate-weakening local compression used. On the other hand, deposition masks, stencils or screens are not desirable as far as speed, customizability and flexibility of the process is aimed at, since they make the deposition process unnecessarily complex and limit the obtainable resolution.

SUMMARY OF THE INVENTION

It is an aim of the present invention to remove some of the problems of the prior art and to provide an efficient and relatively simple method for forming conductive patterns on substrates, the method being suitable for high resolution and throughput even at low temperatures. In particular, it is an aim of the invention to provide a method suitable for paper substrates and other substrates vulnerable at high (>approx. 200-300° C. and even less) temperatures.

It is also an aim of the invention to provide a novel apparatus for deposition of conductive particles in order to form a permanent conductive pattern on a substrate.

The invention is based on the idea of transferring conductive particles in powder form on the substrate in the form of a predefined pattern and utilizing successive thermo-compression of the substrate in order to form conductive bonds between the conductive particles and to affix the pattern to the substrate.

In a preferred embodiment of the invention, screenless application is used for transferring the particles. Most advantageously, screenless electrostatic application is employed.

The method according to the invention comprises forming a conductive pattern on a planar insulating substrate by transferring particle-type conductive matter on a surface of the substrate in the form of a predefined pattern. After the transfer, the particle-type conductive matter is at least partially sintered in elevated temperature and pressure in order to convert the particle-formed pattern into a continuously conducting pattern affixed to the substrate. The sintering is preferably carried out in a nip comprising two opposing nip members, at least one of which may be heatable, between which the substrate is fed.

The transfer of the present kind can be achieved by an apparatus comprising electrostatic transfer means for transferring the particle-type conducting matter onto the surface of the substrate directly into a predefined pattern. As the pattern is in the predefined form, it can be sintered in a sintering nip.

If electrostatic transfer is used, the transfer means typically includes a tool comprising a transfer member (e.g. a roll, plate or belt) having at least one transfer electrode embedded therein and an even dielectric surface layer for preventing discharging of the charged conducting particles transferred on the surface of the member by a voltage applied to the transfer electrode. An apparatus of the above kind allows accurate and convenient screenless transferring of the particles to the substrate.

The method according to the invention is more specifically characterized by what is stated in the characterizing portion of claim 1.

The apparatus according to the invention is characterized by what is stated in the characterizing portion of claim 25.

Considerable advantages are obtained by means of the invention. The method provides an efficient way of forming the conductive pattern on the desired surface by nip sintering. That is, the thermal and compressive exposure need not be focused particularly to the desired area, but generally to the whole area of the substrate.

Particular advantages are gained if screenless electrostatic transfer is used. The technique is widely used for applying powder-like insulating toners to substrates (i.e., electrophotography). However, we have surprisingly found that it can be used for depositing conductive particles in sintering applications with high throughput and resolution.

Another advantage of electrostatic transfer is that the electrostatically transferred conductive particles may be sintered at an elevated temperature and pressure onto the surface of the substrate such that they adhere both to each other and to the substrate even without auxiliary agents or additional processing steps. That is, even essentially metallic particles are screenlessly transferable and sinterable at low temperatures in order to form a well-conducting pattern. As the invention is based on transferring conductive particles with electrostatic forces, followed by sintering of those particles, the method can easily be used in connection with traditional electrophotographic systems in order to create layered structures.

In particular, the present method is suitable for forming conducting structures on flexible substrates, such as papers, boards and polymer films. These kinds of substrates are most suitably treated with roll equipment in web or sheet form.

Means for carrying out the method can be easily installed to large-scale paper machines or printing machines, but also to smaller scale printers. The invention can be used for producing, for example, RFID antennas, printed circuits for various electronic modules, and sensors and the like. The printed pattern may also be used as an authenticity marking of a product. It may also be embedded in an inner layer of a multilayer product, whereby it is hidden from view and protected from mechanical wear.

In a preferred embodiment, the particle-type conductive matter in consists essentially of metal or metal alloy particles. The metal or metal alloy has preferably an atmospheric-pressure melting point less than 300° C. By the present thermo-compression sintering method, such particles may be sintered in less than 250° C., typically in less than 200° C., which makes the method suitable, for example, for conventional paper, the physical properties of which may permanently change at such temperatures. By using such metals, also very high conductivities can be achieved with low material usage. By the novel electrostatic transfer method, also no dielectric tack toners or binding of the conductive particles to or mixing the conductive particles with auxiliary agents is needed.

According to the preferred embodiment of the present invention, screenless electrostatic transfer is used. By a screenless method, we mean an electrophotography-like method, where the conductive particles are deposited on the surface of the substrate directly in the form of the predefined pattern essentially by spatially distributed (local) electrostatic interactions and electrostatic transfer means (the pattern is usually discontinuous at this stage). No additional filters, stencils, masks or screens are used on the substrate or on the transfer member used in order to form the pattern. This feature has the advantage that essentially no powder is wasted or subjected to post-transfer collection and recirculation. This can be made possible by a novel transfer roll arrangement described later in more detail, which allows maintaining the charge of the particles until deposited onto the substrate.

By "at least partial sintering" we mean coalescence of the particles through re-solidification of molten material. That is, at least the surface layer of the particles goes through a reversible change of its physical state. In the sintering, the particles are connected not only electrically with each other, but also directly to the surface structure of the substrate.

Although electrostatic transferring has been found to provide significant advantages, other forms of printing may be employed as well. Of these methods, particularly screen printing, gravure printing, flexographic printing, offset printing, and relief printing are mentioned. Common to all these methods is, that no additional screening during particle deposition or particle removal after deposition is needed, whereby no loss or recirculation of particles takes place. That is, the particles can be initially deposited in a formation that is ready to be sintered in a subsequent two-roll nip or the like.

Other embodiments and advantages of the invention are described in detail below.

BRIEF DESCRIPTION OF THE DRAWINGS

FIGS. 2a and 2b show in cross-sectional view two examples of the transfer and sintering means according to the invention, FIG. 2c shows in a cross sectional view the sintering stage in more detail.

DETAILED DESCRIPTION OF THE INVENTION

Figure 1:
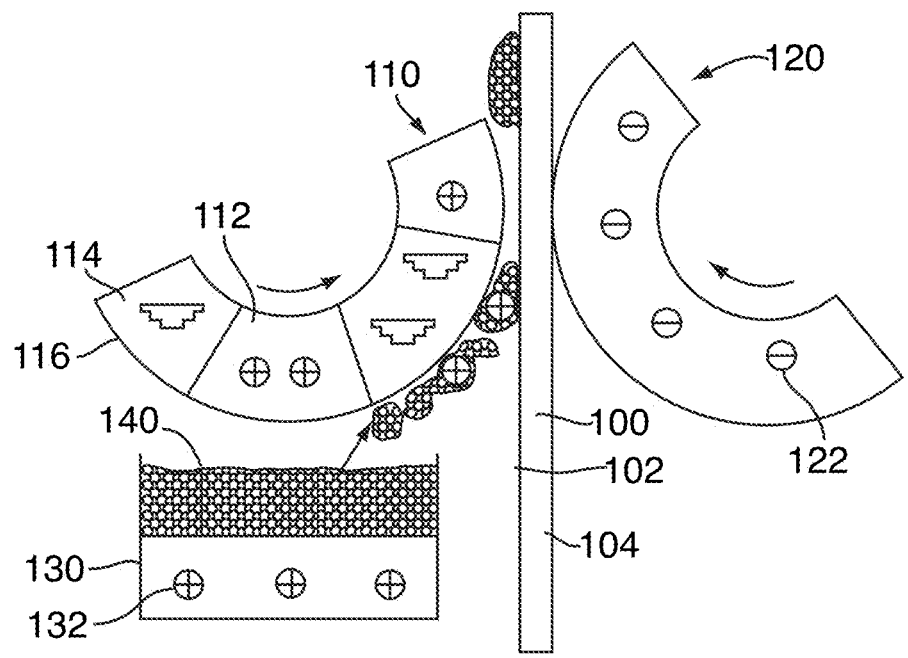
FIG. 1 shows in a cross-sectional view the general principle of electrostatic transfer of conductive particles by using a transfer roll and an electrode roll.

The present method arises from the finding that microparticles can be deposited and permanently affixed to on various substrates, at the same time increasing the conductivity of the pattern deposited. This is achieved by the successive transfer and nip sintering steps. Depending on the deposition method used, no intermediate stages are required (if particles deposited in dry form), or a drying stage for the deposited material is employed (if particles deposited in a liquid suspension).

The method according to the invention is suited inter alia for dry-state conductive (including semiconductive) microparticles in powder form. This embodiment is disclosed in detail below. The conductive particles may be metallic, polymeric, or a combination thereof. The resolution of the created structures is strongly dependent on the particle size of the powdered material, whereas in the deposition and sintering processes the composition of the material is of importance. According to our studies, metallic microparticles are as such well suitable for the method. Those particles and other usable particle types are shortly described below.

Metallic Microparticles

For this embodiment low melting point metals and metal alloys are preferred. Especially tin-bismuth alloy is verified to be suitable for the application. In this context, low melting point metals and alloys include materials having melting points of less than 300° C., typically 50-250° C., in particular 100-200° C. Suitable metals include, e.g. tin, bismuth, indium, zinc, nickel, or similar. The mentioned metals are also preferred components of suitable alloys for the present method, as they have the capability of creating low melting point alloys. For example, tin-bismuth, tin-bismuth-zinc, tin-bismuth-indium or tin-bismuth-zinc-indium in different ratios have proven advantageous in this respect. Changing the ratios of these metals in the alloy can considerably change the melting behavior of the alloy. We have found, that tin-containing alloys, where the ratio of tin in the alloy is 20-90 wt-%, preferably 30-70, wt-% of the total weight of the components in the alloy are both well depositable and sinterable at a low temperature. For example tin-bismuth with 42% wt-% of tin and 58 wt-% of bismuth creates a eutectic alloy which has melting point of 139° C. When changing the ratio to 63 wt-% of tin and 37 wt-% of bismuth the melting starts at 139° C., but e.g. in 150° C. the relative amount of liquid is only about 50% and until above 180° C. the alloys is totally in liquid state. The composition 15.6 wt-% of tin 36.1 wt-% of bismuth and 48.3 wt-% on indium results in a melting point of as low as 59° C. Hence, really low-temperature applications are possible.

The particle size of metal or metal alloy particles is preferably between 0.5 and 100 μm, in very high-resolution applications preferably between 1 and 20 μm. The particles may consist essentially 100% of metal. That is, no auxiliary agents are needed contained in the particles, mixed in the powder or applied in advance on the substrate order to carry out the present method successfully.

Other Materials

Conductive polymers, such as polyaniline (PANI), poly(3, 4-ethylenedioxythiophene) (PEDOT), may be also used in the deposition, however the infusible nature of conducting polymers sets challenges to sintering of materials. Basically, polymers with intrinsic conductivity do not melt or dissolve in any ordinary solvents. However, they have degradation well above 200° C. enabling them to be blended with various synthetic polymers such as polypropylene (PP), polyethylene (PE), polyethylene-co-methylacrylate (EMA), ethylene-propylene-diene terpolymer (EPDM) etc. These composite materials have still conductivity of semiconductor level.

Referring now to FIG. 1, according to a preferred embodiment of the invention conductive separate particles 140 are used for screenless electrostatic printing on insulating substrate material 100. Such a system utilizes charging of particles 140 with a high voltage electrode 132 in a powder carrier 130. Charged particles 140 are transferred from the powder carrier 130 by a first electric field on the surface 116 of a transfer roll 110. The transfer roll 110 is formed from electrodes 112, 114 which are in different potentials. The charged particles 140 attach to the transfer roll 110 according to a potential difference. For example particles 140 with positive charge attach to the areas 114 where the potential is negative or grounded. The charge of the particles 140 is essentially maintained on the surface 116 of the transfer roll 110. From the transfer roll 110 the charged particles 140 move to a transfer nip. In this nip the particles 140 are moved to the substrate by an attractive force generated by an electrode roll 120. Thus, transfer in the nip occurs due to a second electric field between the transfer roll 110 and the electrode roll 120. As understood by a person skilled in the art, the transfer may also be carried out by transfer and electrode plates or belts, or other suitable members, instead of rolls by using the described principle.

Figure 2A:
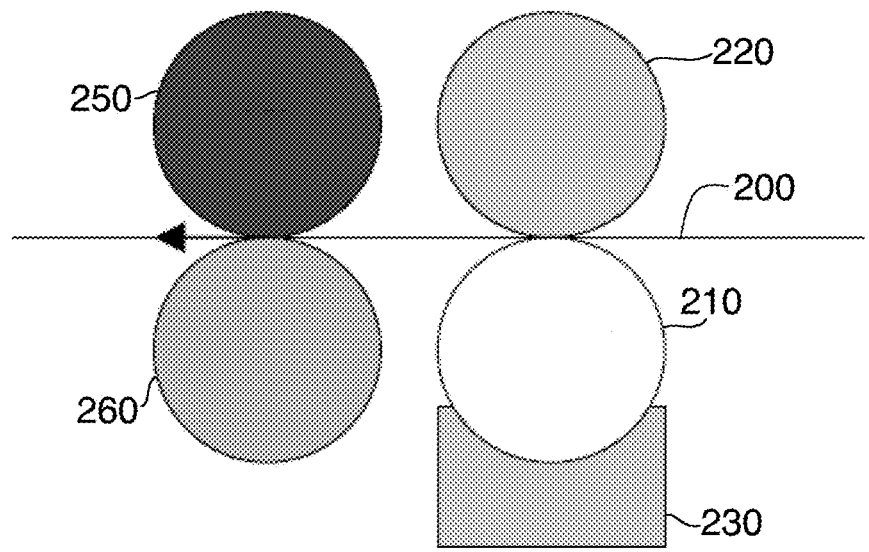

After the particles 140 are transferred on the surface 102 of the substrate material 100, particles 140 are sintered to form continuous, conductive structures. The sintering occurs under temperature and pressure, preferably in a separate or semiseparate sintering nip, which are illustrated, respectively, in FIGS. 2a, and 2b. A separate sintering nip comprises two separate rolls 250, 260, whereas a semiseparate sintering nip utilizes the electrode roll 220 as a counter-roll for the sintering roll 270. One or both of the rolls is heated in order to achieve the desired sintering temperature. Depending on the chosen temperature, also a pressure sufficient to cause sintering to occur is generated in the sintering nip. Instead of sintering in a roll nip, belt or long nip such as shoe-nip can be used. In these methods the nip length can be several millimeters, typically between 2-500 mm, and have pressures varying between 10-20000 kPa. Configurations for heating uses same principles as with roll nip systems described above.

In the sintering step the desired conductive (including semiconductive, depending on the properties of used material) surface pattern is formed. This is illustrated in FIG. 2c, where the particle-formed pattern is denoted with a reference number 240 and the sintered pattern with 240'. The substrate is denoted with the reference number 200. With conductive metal or metal alloy particles 240 the objective is to form patterns with equal conductivity to bulk metals or alloys. By equal conductivity we mean a conductivity level of about 1:100-1:1 of the bulk conductivity. This is possible by direct coalescence of the conductive particles with each other.

The described transfer and sintering technique makes it needless to use screens or masks in order to achieve the desired conductor pattern. The desired pattern geometry is temporarily formed as a powder-like top layer on the transfer member before further depositing it on the substrate. In particular, an even and uniform roll surface may be used, which allows high resolution transfer, down to a resolution level of 100-300 mm, even 50-100 mm, and even less (in term of obtainable line width). In particular, in present two-phase screenless deposition process the deposited particles lose their charge not before having been deposited onto the substrate. Typically the charge is allowed to decay mainly to the substrate, but also a neutralizing ionizer may be used (see detaching system below).

The substrate can be almost any insulating and planar sheet or web. Paper, board and polymer films (plastics) have been found to suit well for the process, but other similar non-conductive surfaces may be also used. Paper or board can be coated, uncoated, wood-free or wood-containing. Multilayered substrates are also usable.

Other possible substrates include textiles, non-woven materials, circuit boards of electronics industry, moulded articles, glass, construction materials, such as wallpapers and floor coatings, unfired and fired ceramics, (bio)polymer bases and composites. Each one of the listed substrates has its own application areas and advantages.

In particular, the present method involving nip sintering is suitable for substrate has a shattering or deformation point below 300° C., in particular below 250° C., even below 200° C., that is, at least various paper and plastic grades not tolerating high temperatures.

Figure 3:
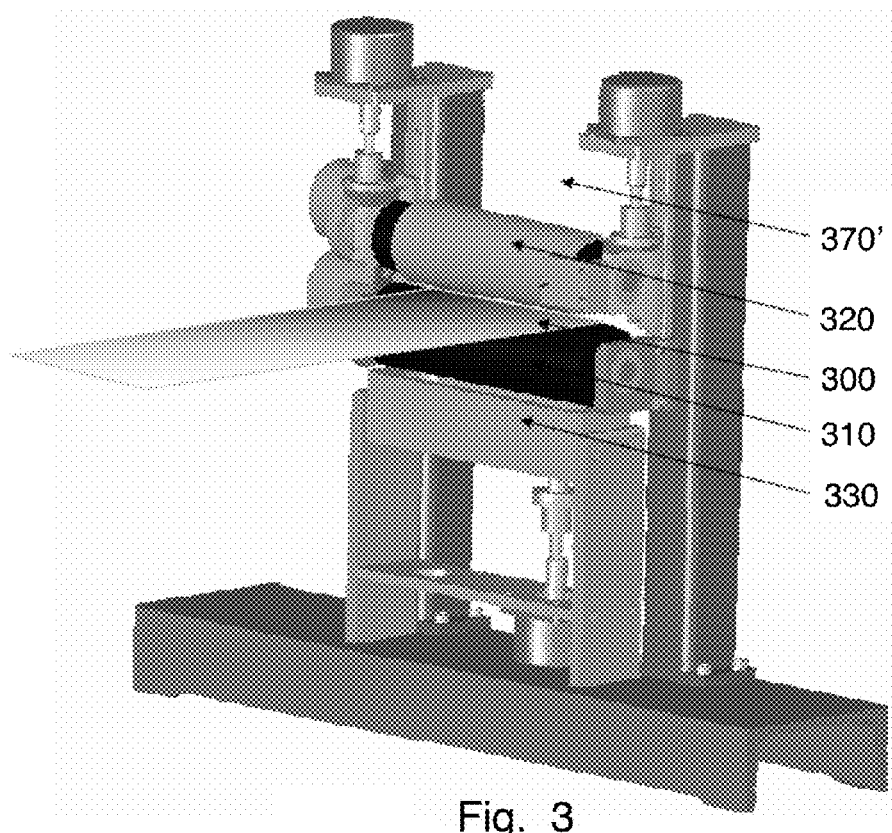
FIG. 3 shows in a perspective view a transfer nip mounted on a printing apparatus.

FIG. 3 shows an exemplary apparatus having a powder carrier 330, transfer roll 310, electrode roll 320 installed on a device body. The substrate 300 is in its treatment position between the rolls 310, 320. The installing position of a possible semiseparate sintering nip roll is denoted with the reference number 370'.

Powder Container

A powder container, such as 130, 230, 330, is used for particle storage and charging. Charging can be made by conduction, by tribocharging (e.g. with insulating material present in the powder) or by charging with excess amount of ions (corona charging, plasma). For example, when using conductive (metallic) particles, the particles attain in the powder carrier an equal potential to the underlying electrode plate. By tribocharging the conductive particles are brought in contact with insulating structure, particles or surfaces, through which they attain charge. After this they are transferred on the transfer roll surface, by means of an electric field. We have found, that usually a certain threshold voltage is required in order for the charge to distribute evenly to the particles in the particle carrier. The level of the threshold voltage depends on the type of particles, tin-bismuth alloy typically requiring a voltage of about 200 V.

In the powder box 130 powder fluidization is recommended in order to create homogenous powder dispersions. This ensures even transfer and deposition of particles to the transfer roll. Fluidisation can be made with air, mechanic vibration and by using repulsive electrostatic forces (with conductive particles).

Transfer Roll

The transfer roll consists of electrodes, which are in different potential than the particle deposited on the surface of the transfer roll. This potential difference may be created also with different surface charges in surface of roll, belt or like. The electric field between the powder carrier and the transfer roll is created to these electrodes. When an electric field is formed between the powder carrier (and powder in it) and transfer roll, the charged particles transfer due to the electric field to the surface of the transfer roll.

Figure 4A:
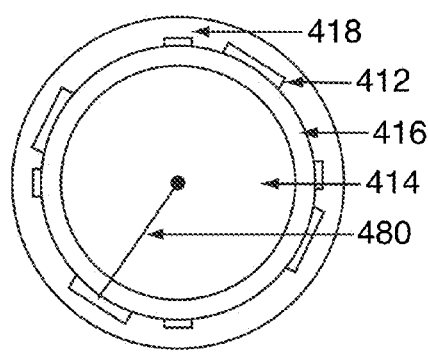
FIG. 4a shows as a cross sectional image a transfer roll construction suitable for electrostatic transfer of fully conducting particles, FIG. 4b show an enhanced embodiment of the roll of FIG. 4a, having a backing electrode for increased resolution.

FIG. 4a shows a suitable roll structure for thoroughly conductive particles. In such a roll, a non-conductive surface finish 418 is used on the transfer electrodes 412. Thus, the particles on the surface of the transfer roll do not loose their charge and they remain on the surface until the particles are transferred in the transfer nip to the substrate surface. The roll body, made for example from POM, is denoted with the reference number 414. The roll body is provided with an adhesive layer 416, which serves as an underlying for the transfer electrodes 412. The transfer electrodes 412 can be made of copper or other conductive metal, and are controlled with electrical signal or grounding wires or lines 480. The surface layer 418 of the transfer roll may comprise a continuous and even layer of dielectric material, for example, non-conducting polymer or ceramic. Polyimide has been found to be mechanically and electrically well suitable for the purpose. No surface patterning or other spatial surface treatment of the transfer roll is needed either before or during transfer, as the electrostatic force between the transfer electrodes 412 and the conductive particles is sufficient for holding the particles on the transfer member.

Figure 4B:
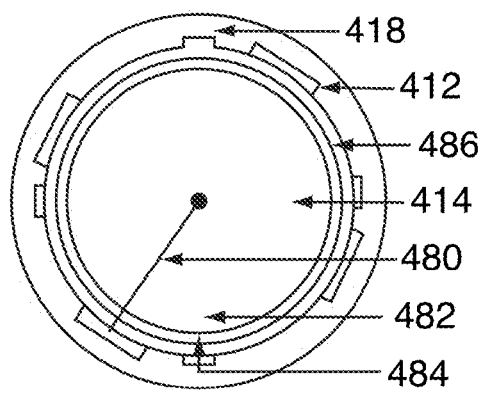
FIG. 4c shows in a perspective view a programmable transfer roll comprising a dense grid of transfer electrodes.
Figure 5:
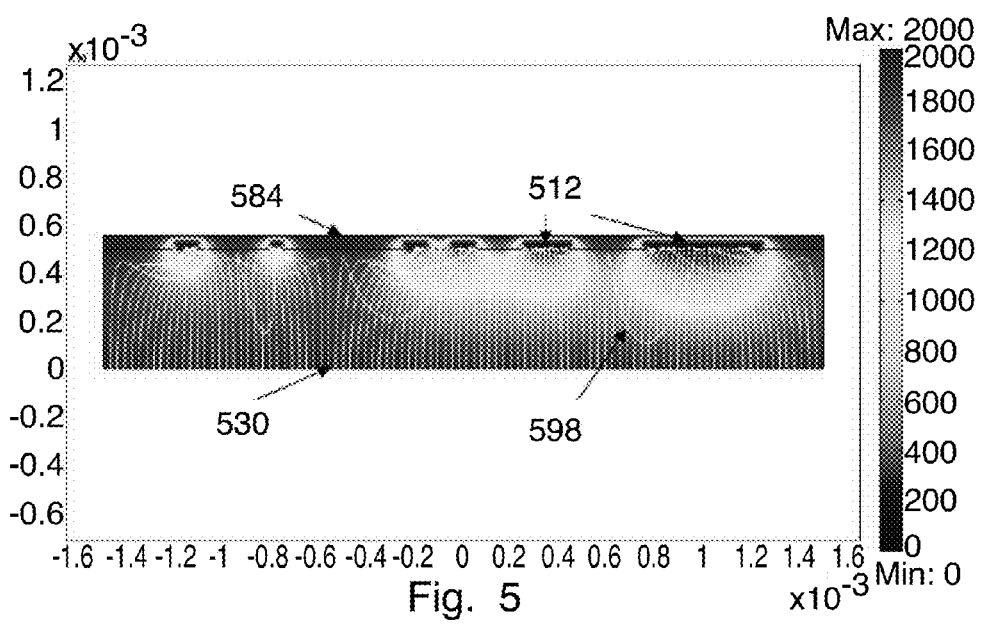
FIG. 5 shows as a the effect of the backing electrode of FIG. 4b, FIGS. 6a and 6b show microscopic images of the structure achieved by the present method by using 30 mm and 80 mm particle sizes, respectively.

It is favored that the transfer roll is equipped with a backing electrode 484 (e.g. a metallic foil underneath the copper pattern electrodes), as shown in FIG. 4b. This backing electrode 484 enables the electric field to be concentrated on precise areas, and thus create desired pattern structures with the charged particles. FIG. 5 shows a calculated example of the field-focusing effect of the backing electrode. Without the electrode 584 present behind the electrodes 512, the "hot spots" of the field would be at least threefold in horizontal diameter compared to the situation shown. The placement of the powder box is shown as 530, whereas curved lines 598 show the calculated particle trajectories when they move from the powder box to the vicinity of the electrodes 512.

Figure 4C:
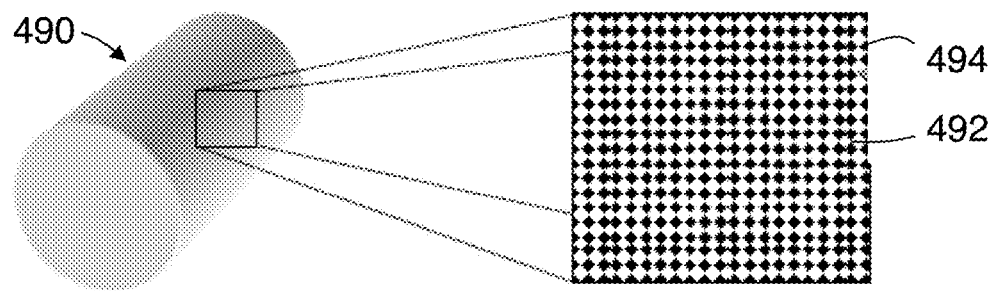

The transfer roll may also consist of a grid of separate electrode points, the potential of the points being controllable. Such a roll is shown in FIG. 4c. The size and pitch of the points must match the desired resolution level. As described above, if thoroughly conducting particles are used, the top of the pin, which comes into contact with the charged particles, must have an insulating layer applied thereon, to prevent particle charge decay. To be more exact, the insulating layer may in fact enable a charge decay, but in a controlled manner. For example, a volume resistivity of $10^6$-$10^{11}$ Ohm*m is acceptable.

In addition to this, self-organizing materials can be used to create charged areas in which charged particles transfer. In self-organization of polymers the substrate is charged and then dipped into polymer-solvent bath where one polymer layer is attached to the substrate surface. Because polymers have a tendency to fold in coils the surface of the polymer does not become neutralized by the charge on the substrate. Next layer of the polymer can be dipped similarly to the previous layer but with opposite charge. The polymer layer can be patterned with a neutral material before dipping. Thus part of the resulting surface is charged and another part is neutral. Also if the neutral masking material is chosen so that it can be removed, a surface of patterned opposite charges can be obtained. This kind of surface could be used as similar systems to traditional electrophotography. In latter one due to the effect of light (e.g. laser) the exposed areas are neutralized. Thus, also a photoconductor similar as in electrophotography may be used, if charge decay of conductive particles can be prevented.

Electrode Roll

The electrode in its simplest form is roll consists of a metal roll, which is insulated from the other system components and is in opposite potential to the charged particles. The purpose is to create an electric field between the transfer roll (and with the particles on its surface) and the electrode roll for enabling transfer of the particles to the surface of the substrate. In addition to this in particle transfer corona charging can be used to create a potential difference between the charged particles and the substrate. The opposite side of the substrate can be charged with ions from corona charging and the other side of the substrate is in contact or in close proximity to charged particles and thus particle transfer occurs.

Detach System

After the particles have been transferred to the substrate surface there may be need for detachment of the substrate and the particles from the electrode roll. Depending on the dielectric properties (both volume and surface resistivity) of the substrate, the particles have a tendency to sustain the electrostatic force towards the electrode roll. This is caused by the potential difference between the particles and the roll. To decrease the electrostatic force between the particles and the electrode roll, several actions can be made. First, the moisture content of the web with fiber-based materials (paper and board) can be increased to enable charge transfer from the particle to the web, with fiber-based and polymer films or the like. Second, an alternative current ionizer can be used to neutralize the charges of the particles. Third, the potential difference may be arranged to remain stable until the charge of the particles decays (for example by letting the web be in contact with the electrode roll for a longer period). Fourth, the particles may be sintered while still in contact with the electrode roll (the so-called semiseparate sintering nip of FIG. 2b described above).

We have found that successful detaching of the conductive particles from the influence of electrode roll after transfer is better achieved at certain conditions, whereas in other conditions the detaching is insufficient, which is seen in the quality of the pattern. In particular when paper or board is used as a substrate and a moisture-dependent detaching is utilised, the relative humidity of the process environment is preferably about 20-90%, typically 30-60%. This relative humidity means for example paper moisture contents between 2-20%. This provides the charged particles a suitable charge decay time for the detaching.

Sintering System

In sintering process the metallic (or polymer) powder particles are sintered together to form a continuous, conductive structure. The sintering procedure utilizes simply pressure and temperature (either in a roll or plate configuration). This is used to exceed the melting and sintering temperature of the used conductor material. Either one of both of the rolls, plates or belts in the sinter nip may be heated. The surface materials of the heated material should tolerate the temperature used (e.g., 50° C.-250° C.) without deformation. Possible surface materials for the roll are e.g. tungsten carbide, hard chrome, PTFE covers and its derivatives and ceramic material with anti-sticking properties (low surface energy). The sintering may occur in direct contact with the heated roll or the heat may be transferred through the substrate material. Also both contacting rolls may be heated to increase heat transfer in the nip. Our studies indicate, that for maximizing the affixation of the particles to the substrate, it is preferred that at least the roll or plate coming into contact with the surface of the substrate not comprising the particle-formed pattern (second roll) is heated. The roll in contact with the powder (first roll) may be in considerably lower temperature, even unheated and cooled. Durable patterns are, however, achieved by heating that roll (first roll) only.

Important roll surface properties are a very high smoothness (preferably, Ra<1 µm) and low surface energy (preferably, <100 mN/m). This is to decrease the sticking tendency of melted metals to the roll.

The heating can be made also with laser, or by induction, IR heating and microwave heating prior to compression in a nip. Special Features of Deposition Systems for Semi-Conducting Materials (and Also Insulating Materials for Layered Structures)

For semi-conductors and insulating materials the principle of deposition may occur similarly to traditional electrophotography. By semi-conductors we mean inherently semi-conducting materials or aggregates comprising conducting and insulating material (i.e., particles having a considerable charge decay time). Difference to charging of conductive particles is the charging methods, which are tribocharging and charging with excess amount of ions, e.g. field charging (high voltage, 1000-20000 V, used to create corona, and thus large amount of ions). The method can also be well used for creating layered structures. Particles with different properties (e.g. metallic and polymeric) will preferably be deposited in separate steps. For example, first, metallic conductive paths can be deposited and sintered, after which insulating materials (polymers, lacquers) can be deposited on the surface and sintered. Notable is that any underlying layer must not be destroyed in the following steps. This can be achieved e.g., by selecting the melting point of the underlying materials higher than the melting point of the topmost material. Alternatively, thermosetting resin can be used to prevent the re-melting of the material. The original melting point of the used resin can, actually, be lower than the material, which is deposit over it. When some cross-linker is mixed with the resin, the resin will be cross-linked during the application process. The initiator triggering the cross-linking reaction can be for instance heat, UV- or other radiation. The cross-linked layer is not anymore moldable by heating. As example of these resins can following groups be mentioned: phenol-formaldehyde, amino and furan resins, unsaturated polyester and vinyl ester resins, allyls, epoxy resins, thermoset polyurethanes, polyimides and silicones.

Experimental Results

The system used in experimental tests was designed for sheet printing, but had no restrictions concerning web-based materials and wider system. The operation speed was limited by the transfer rate of particles to the transfer roll and further to the substrate surface in the transfer nip, and in addition the sintering process (required dwell time to achieve sufficient sintering, melting of the material). The dwell times for sintering particles varied between 1 ms-10 s, temperatures were varied depending on the material melting points of the materials between 50-250° C. and pressure was varied between 50 kPa to 10 MPa.

Figure 6A:
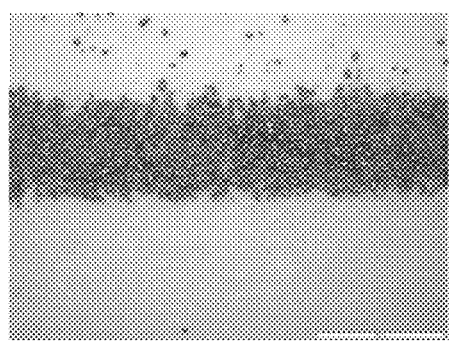
Figure 6B:
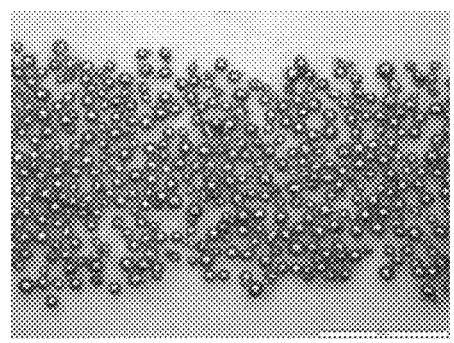

FIG. 6a shows particles transferred on paper surface prior to sintering. The line width is 500 µm and the particles used have an average diameter of 30 µm. In FIG. 6b, a sintered structure having a line width of 1 mm and an average particle diameter of 80 µm is shown. The smaller the particles, the better the resolution achieved. Typically the particle size range for commercial tin-bismuth powders is 5-100 µm. Well-conducting patterns can be achieved over whole this range.

Figure 7A:
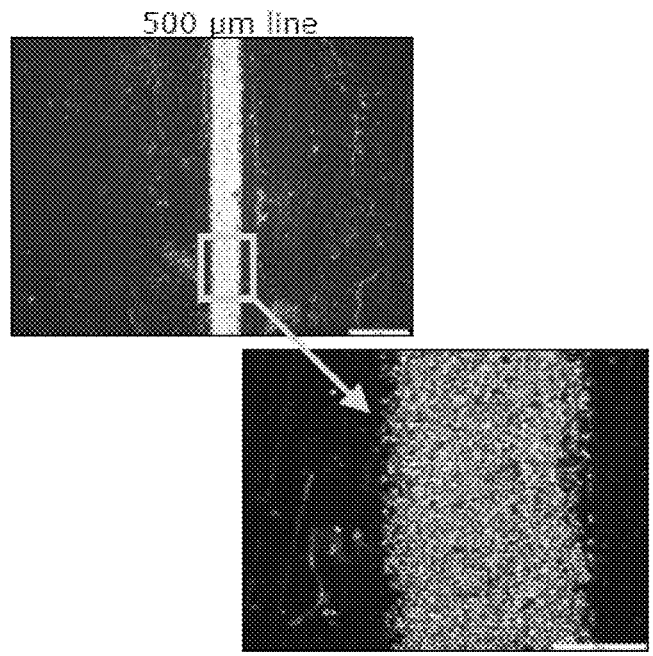
FIGS. 7a and 7b show microscopic images of 500 mm and 300 mm lines, respectively achieved by the present method by using 10 mm tin-bismuth particles.
Figure 7B:
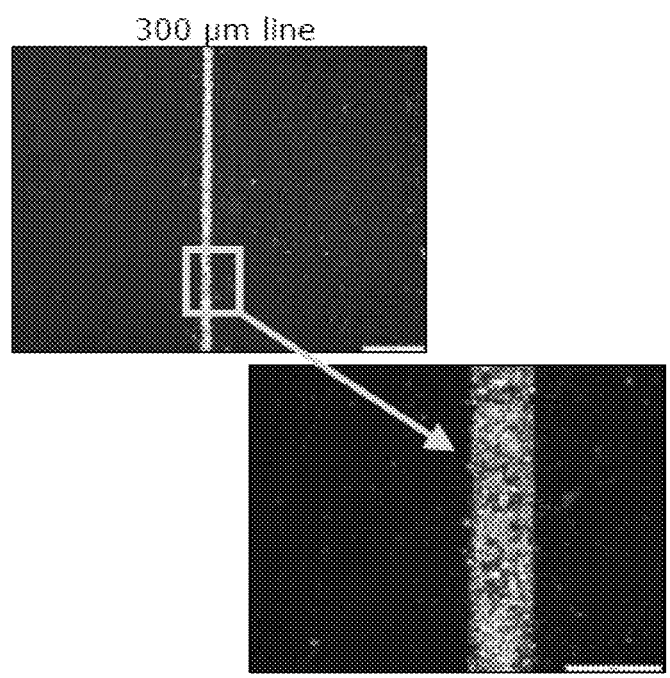

FIG. 7a shows a 500 µm line and FIG. 7b a 300 µm tin-bismuth line deposited on a PET-film. The average particle size is 10 mm. A continuous structure was achieved in both cases.

Figure 8A:
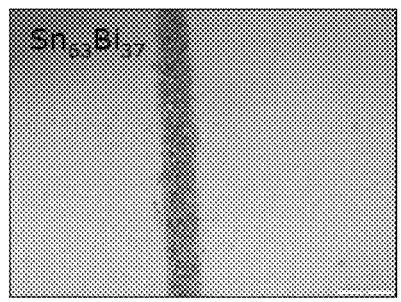
FIGS. 8a and 8b show microscopic images of a tin-bismuth conductor in a general and zoomed view, respectively.
Figure 8B:
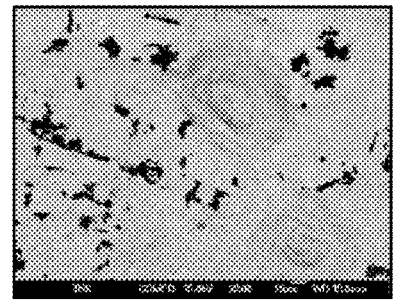

FIGS. 8*a* and 8*b* present tin-bismuth powder sintered on paper surface in two different scales. In FIG. 8*a*, the line width is 500 μm and the length of the scale bar in FIG. 8*b* equals to 10 μm.

Figure 9:
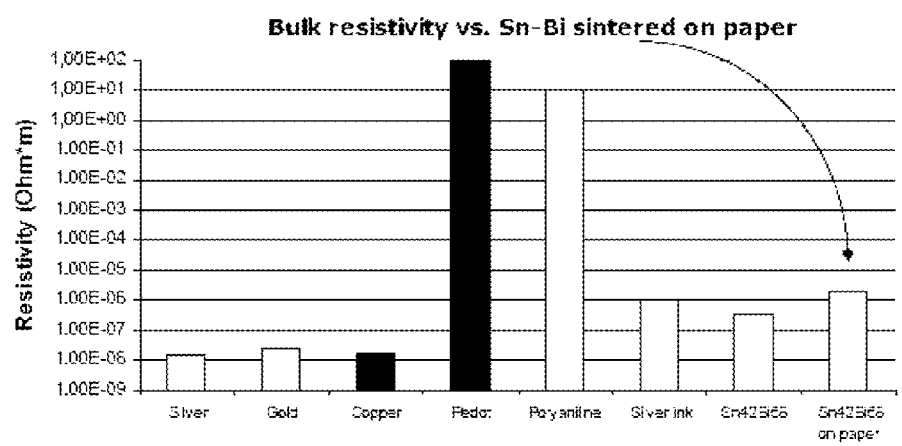
FIG. 9 shows a chart illustrating the bulk resistivities of different materials and material structures, including a tin-bismuth structure achieved by the present method.

From FIGS. 6-8 can be seen, that the particles are merged directly with each other so as to form a continuous conductor structure. The importance of this fact is shown in FIG. 9, which shows experimental conductivity measurement results for a electrostatically transferred and sintered tin-bismuth alloy with respect to bulk tin-bismuth and several other metals and polymers. It can be seen, that an electric conductivity almost equal to bulk metal is achieved.

In the following, suitable transfer methods other than those described above are described in more detail:

Electrofotographic Transfer

Basically electrostatic transfer can be carried out as described above (dry/traditional electrophotography). Other forms include liquid electrophotography, in which a solvent is used. The tin-bismuth particles (or other suitable particles) are deposited in the solvent. The solvent is evaporated or absorbed by the substrate (in particular paper or board), whereafter the sintering is carried out for (almost) dry particles. Possible transfer mechanisms, in addition to those described above, include cascade development (two-component development), fur brush development, magnetic brush development, impression development, powder-cloud development, liquid spray development, liquid electrophoretic development, heat development, liquid film development, selective toner (tin-bismuth) release and others.

Screen Printing

Liquid-form "colour" is transferred to the substrate through a web-like screen means (cloth or metal) or through a stencil. The tin-bismuth (or other suitable particles) is dispersed into a solvent or carrier medium, which is used for applying the particles as a liquid paste onto the substrate. The solvent is evaporated or absorbed into the substrate before sintering.

Gravure Printing, Flexographic Printing, Offset Printing, Ink-Jet Printing and Relief Printing Tin-bismuth (or other suitable particles) is dispersed in a solvent or carrier medium, which is used for applying the particles as a liquid paste onto the substrate according to the technique in question. The solvent is evaporated or absorbed into the substrate before sintering.

Generally speaking, the disclosed technique can be varied such that some other sintering technique instead of nip sintering is used. Thus, in a general form, the method comprises forming a conductive pattern on a planar insulating substrate in particular so that particle-type conductive matter is transferred onto a surface of the substrate into a predefined pattern, and the particle-type conductive matter is at least partially sintered at elevated temperature and pressure in order to convert the particle-formed pattern into a continuously conducting pattern affixed to the substrate.

As described above, preferably an electrostatic transfer method and transfer means capable of screenless transferring of the particle-type conductive matter onto the surface of the substrate into a predefined pattern are used, but other printing methods can be employed too. Thus, all embodiments described in this document and those defined in the appended claims may be freely combined with the basic concept disclosed above.

While the present invention has been illustrated and described with respect to a particular embodiment thereof, it should be appreciated by those of ordinary skill in the art that various modifications to this invention may be made without departing from the spirit and scope of the present invention.

What is claimed is:

1. A method for forming an electrically conductive pattern on a planar insulating substrate, wherein particle-type electrically conductive matter is transferred onto a surface of the substrate, the particle-type electrically conductive matter has a melting point at less than 300° C., and the particle-type electrically conductive matter is at least partially sintered at elevated temperature and pressure in order to convert the particle-type electrically conductive matter into a continuously electrically conductive pattern affixed to the substrate; wherein the electrically conductive matter is transferred in the form of a predefined pattern; and the sintering is carried out by using a nip comprising two opposing nip members between which the substrate is fed.

2. The method according to claim 1, wherein the particle-type conductive matter is comprised of metal or metal alloy.

3. The method according to claim 1, wherein the particle-type electrically conductive matter has melting point preferably less than 200° C.

4. The method according to claim 1, wherein the particle-type electrically conductive matter has a particle size of 0.5-100 μm.

5. The method according to claim 1, wherein the substrate is a fiber-based product, such as a paper or board, or a polymeric film.

6. The method according to claim 1, wherein the substrate has a shattering or deformation point below 300° C., in particular below 250° C., even below 200° C.

7. The method according to claim 1, wherein the step of sintering is carried out at a temperature of less than 250° C., preferably 50-250° C., in particular 100-200° C., and at a pressure of less than 20 MPa, preferably 10 kPa-20 MPa, in particular 50 kPa-10 MPa.

8. The method according to claim 1, wherein said nip members comprise rolls, plates, belts or long nips such as shoe-nips, between which the substrate is fed.

9. The method according to claim 8, wherein the nip member coming into contact with the surface of the substrate not comprising the particle-formed pattern is heated for enhancing affixation of the electrically conductive pattern to the surface of the substrate.

10. The method according to claim 8, wherein the nip member coming into contact with the particle formed pattern is unheated or only slightly heated.

11. The method according to claim 1, wherein tin or an alloy comprising tin and bismuth is used as the electrically conductive material of the particle-type electrically conductive matter, the ratio of tin in the alloy being 20-90 wt-%, preferably 30-70 wt-% of the total weight of these components.

12. The method according to claim 11, wherein an alloy comprising also indium and/or zinc, amounting to 1-60 wt-% of the total weight of the alloy is used.

13. The method according to claim 1, wherein after sintering the first electrically conductive pattern, at least one additional insulating layer in deposited on the surface of the substrate comprising the electrically conductive pattern and at least one additional second electrically conductive pattern is transferred and sintered on the second insulating layer.

14. The method according to claim 13, wherein the shattering or deformation point of the additional insulating layer is lower than the shattering or deformation point of its underlying insulating layer.

15. The method according to claim 14, wherein the additional insulating layer is made of thermosetting material, which is cross-linked.

16. The method according to claim 1, wherein the particle-type electrically conductive matter is transferred on the substrate by an electrostatic transfer method.

17. The method according to claim 16, wherein the particle-type electrically conductive matter is transferred on the substrate by
- charging the particles of the particle-type electrically conductive matter,
- transferring, by means of a first electric field, the particles to predetermined areas of a transfer member, such as a roll, plate or belt, and
- transferring the particles from the transfer member on the substrate by a second electric field.

18. The method according to claim 1, wherein an electrostatic transfer method capable of screenless transferring of the particle-type electrically conductive matter onto the surface of the substrate into a predefined pattern is used.

19. The method according to claim 16, wherein the step of electrostatic transfer, a transfer member, such as a roll or plate, having at least one transfer electrode covered with an dielectric surface layer is used.

20. The method according to claim 1, wherein the particle-type electrically conductive matter is transferred on the substrate by screen printing.

21. The method according to claim 1, wherein the particle-type electrically conductive matter is transferred on the substrate by gravure printing.

22. The method according to claim 1, wherein the particle-type electrically conductive matter is transferred on the substrate by flexographic printing.

23. The method according to claim 1, wherein the particle-type electrically conductive matter is transferred on the substrate by offset printing.

24. The method according to claim 1, wherein the particle-type electrically conductive matter is transferred on the substrate by relief printing.

25. The apparatus according to claim 1, wherein the transfer means comprise means for printing using a method selected from the group of: screen printing, gravure printing, flexographic printing, offset printing, and relief printing.

26. The method according to claim 1, wherein the particle-type electrically conductive matter has a particle size of 1-20 µm.

* * * * *